United States Patent
Marume

(10) Patent No.: US 7,336,731 B2
(45) Date of Patent: Feb. 26, 2008

(54) DEMODULATOR WITH PHASE-ADJUSTING FUNCTION

(75) Inventor: Kei Marume, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 718 days.

(21) Appl. No.: 10/755,272

(22) Filed: Jan. 13, 2004

(65) Prior Publication Data

US 2004/0196932 A1    Oct. 7, 2004

(30) Foreign Application Priority Data

Jan. 14, 2003    (JP) .............................. 2003-005997

(51) Int. Cl.
*H03D 3/00*    (2006.01)

(52) U.S. Cl. .................. 375/322; 327/156; 329/304; 375/327; 375/332; 375/334; 375/344; 375/375; 386/28

(58) Field of Classification Search ................ 329/304; 375/222, 327, 332, 334, 344; 327/159, 306; 386/28

See application file for complete search history.

(56) References Cited

U.S. PATENT DOCUMENTS

| | | | |
|---|---|---|---|
| 4,901,159 A | * | 2/1990 | Hitotsumachi ............... 386/28 |
| 6,038,267 A | | 3/2000 | Oura et al. |
| 6,348,823 B1 | * | 2/2002 | Pan ............................ 327/159 |

FOREIGN PATENT DOCUMENTS

| | | |
|---|---|---|
| JP | 10-173715 | 6/1998 |
| JP | 2003-101600 | 4/2003 |

OTHER PUBLICATIONS

FSK Demodulator; Kameno Toshiaki: JP 10-173715; Jun. 26, 1998.*

* cited by examiner

*Primary Examiner*—David C. Payne
*Assistant Examiner*—Adolf DSouza
(74) *Attorney, Agent, or Firm*—Oblon, Spivak, McClelland, Maier & Neustadt, P.C.

(57) ABSTRACT

A demodulator with a phase-adjusting function including a detector including a delay detector delaying an input signal in delaying stages using a first clock obtained by frequency-dividing a sampling-clock at a first-ratio to output a delayed modulated signal, the sampling-clock having a predetermined frequency and a predetermined clock number, and a phase-adjustor which, when the stage number of the delaying stages obtained by dividing the predetermined clock number at the first-ratio does not become an integer, delays the input modulated signal using a second clock, the second clock obtained by frequency-dividing the sampling clock at a second-ratio, a ratio between the second-ratio and the first-ratio corresponding to a shortage in a final delaying stage to produce a phase-adjusted modulated signal that has been adjusted to cause the phase of the input modulated signal to coincide with the phase of the delayed modulated signal.

7 Claims, 3 Drawing Sheets

DEMODULATOR WITH PHASE-ADJUSTING FUNCTION

CROSS-REFERENCE TO RELATED APPLICATION

This application is based upon and claims the benefit of priority from the prior Japanese Patent Application No. 2003-5997, filed on Jan. 14, 2003, the entire contents of which are incorporated herein by reference.

BACKGROUND OF THE INVENTION

1. Field of the Invention

The present invention relates to a demodulator with a phase-adjusting function, and in particular to a demodulator with a phase-adjusting function which is used for uniformly arranging two phases of an input modulated wave and a delayed modulated wave in a wave detecting section of the demodulator which demodulates a frequency-modulated wave.

2. Related Background Art

Whether a radio signal or a cable signal, in the signal processing field it is generally the case that when a frequency-modulated signal is demodulated in a digital demodulator, a demodulator must delay a base band signal by one cycle using a shift register comprising a flip-flop circuit (hereinafter, abbreviated as an FF circuit) inputted with a sampling clock as an input clock. Therefore, the demodulator requires an FF circuit having several hundred stages due to a signal to be delayed, and using a shift register comprising such an FF circuit with multiple stages results in an increase of the entire circuit scale of the demodulator.

In order to overcome the problem of increasing the demodulator circuit scale, it has been conventionally thought that the number of stages in the FF circuit should be reduced by frequency-dividing a sampling clock and by using the divided clock as a clock input for the FF circuit, but the following problems arise in the reduction of the number of the stages.

In case that the sampling clock is frequency-divided to produce a clock for the FF circuit, the cycle of the base band signal does not coincide with integer times the cycle of the clock for the FF circuit due to a frequency division ratio, and a phase of a clock for the FF circuit when a modulated wave with the original frequency and a delayed modulated wave are inputted in a multiplier causes "a phase shift" corresponding to a half cycle. There is a problem that such a "phase shift" causes lowering of a detection precision in the demodulator.

Further, adherence to maintaining the detection precision in the demodulator causes such a constraint that the cycle of a clock input into a delaying FF circuit must be multiplied by integer times the base band signal. Therefore, since a circuit for multiplication must be added newly, there occurs a problem that reduction in circuit scale of the entire demodulator is obstructed.

SUMMARY OF THE INVENTION

In order to achieve the above-described advantage, a demodulator with a phase-adjusting function according to an embodiment of the invention comprises a detecting section including;

a delay detection circuit which delays an input modulated signal in a plurality of delaying stages using a first frequency-divided clock obtained by frequency-dividing a sampling clock at a first frequency division ratio to output the delayed modulated wave signal, said sampling clock having a predetermined frequency and a predetermined clock number, and a phase-adjusting circuit which, when the stage number of the plurality of delaying stages which is obtained by dividing the predetermined clock number at the first frequency division ratio does not become an integer, delays the input modulated wave signal using a second frequency-divided clock, said second frequency-divided clock being obtained by frequency-dividing the sampling clock at a second frequency division ratio, a ratio between said second frequency division ratio and said first frequency division ratio corresponding to a shortage in a final delaying stage to produce a phase-adjusted modulated wave signal which has been adjusted to cause the phase of the input modulated wave signal to coincide with the phase of the delayed modulated wave signal; and a demodulating section which performs predetermined arithmetic operation of the delayed modulated wave signal and the phase-adjusted modulated wave signal to output a digital demodulated signal.

A demodulator with a phase-adjusting function according to the other embodiment of the invention comprises a detecting section including;

a delay detection circuit which delays an input modulated signal in delaying stages using a first frequency-divided clock obtained by frequency-dividing a sampling clock at a first frequency division ratio N1 to output the delayed modulated wave signal, said sampling clock having a predetermined frequency and a predetermined clock number A, said delaying stages having (Int(A/N1)+1) stages, and a phase-adjusting circuit which, when A/N1 is indivisible, delays the input modulated wave signal using a second frequency-divided clock, said second frequency-divided clock being obtained by frequency-dividing the sampling clock at a second frequency division ratio N2 to produce a phase-adjusted modulated wave signal which has been adjusted to cause the phase of the input modulated wave signal to coincide with the phase of the delayed modulated wave signal, said second frequency division ratio N2 implementing N2=(N1*(1−Frc(A/N1)))/X2; and a demodulating section which performs predetermined arithmetic operation of the delayed modulated wave signal and the phase-adjusted modulated wave signal to output a digital demodulated signal.

Wherein Int(A/N1) is an integer portion of A/N1, Frc (A/N1) is a fraction portion of A/N1 and X2 is a number of the delay stages in the phase-adjusting circuit.

DETAILED DESCRIPTION OF THE INVENTION

Figure 1:
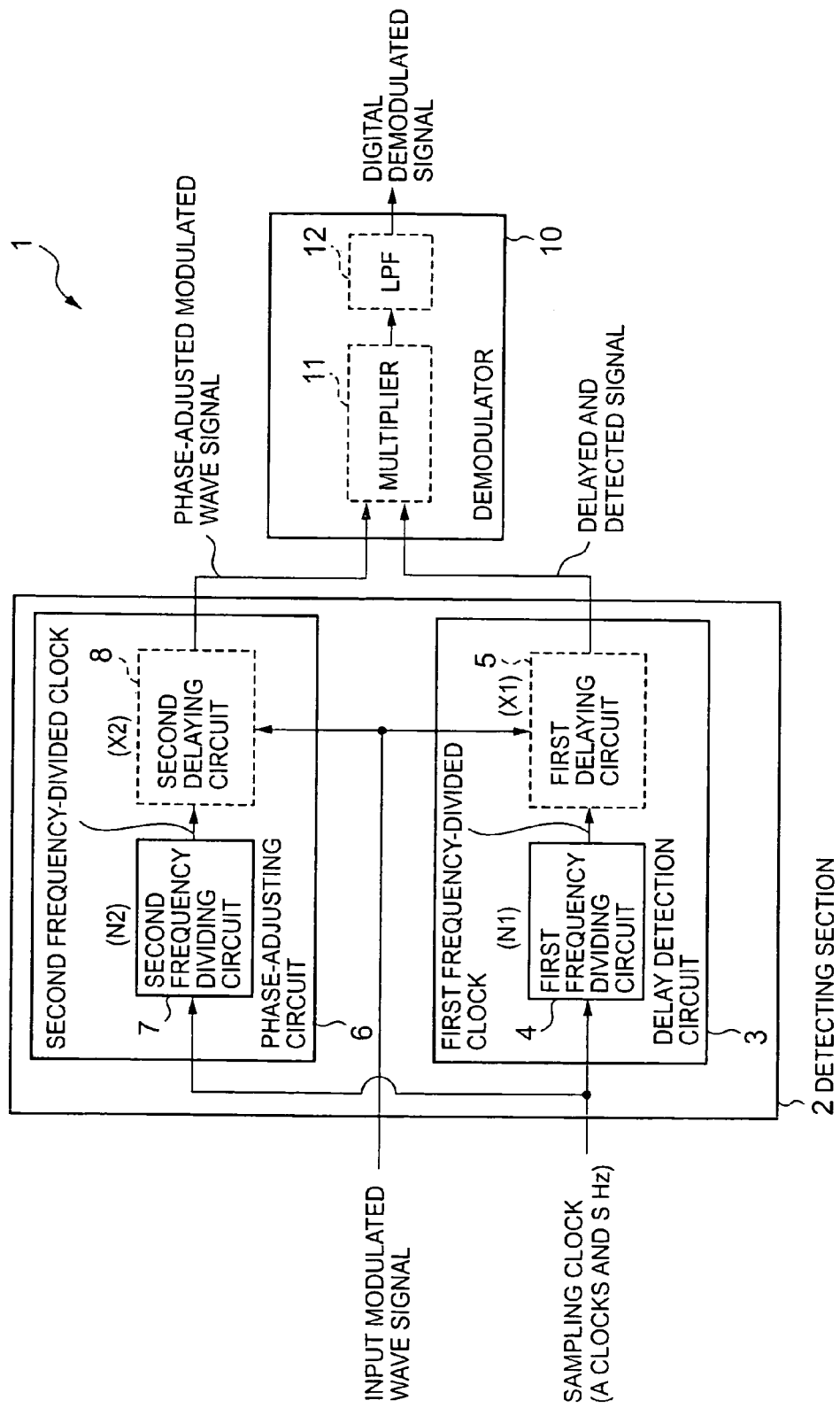
FIG. 1 is a block diagram showing a configuration of a demodulator having a phase-adjusting function according to a first embodiment as a basic configuration of the present invention.

A phase-adjusting circuit in delay detection according to an embodiment of the present invention will be explained in detail below with reference to the accompanying drawings. First, a delay detection and phase-adjusting circuit according to a first embodiment showing a basic configuration of the present invention will be explained with reference to FIG. 1. FIG. 1 is a circuit block diagram showing a circuit configuration of a phase-adjusting circuit in delay detection according to the first embodiment of the present invention.

The following embodiment has a phase-adjusting function in delay detection, in which, even if a cycle of a base band signal does not meet integer times a clock cycle when a sampling clock is frequency-divided in order to make a clock for an FF circuit, a so-called "phase shift" does not occur and a constraint to the FF circuit is relaxed while a detection precision in a demodulator is being maintained so that a circuit scale can be reduced.

In FIG. 1, a demodulator 1 having a phase-adjusting function according to the first embodiment comprises a detecting section 2 for performing delay detection on an input modulated wave signal and a demodulating section 10 for performing a predetermined arithmetic operation to a modulated wave signal by using the delay signal detected by the detecting section. The detecting section 2 comprises a delay detection circuit 3 which delays the input modulated wave signal on the basis of a sampling clock with a predetermined frequency S (Hz) and a clock number A to output a delayed modulated wave signal, and a phase-adjusting circuit 6 which produces a phase-adjusted modulated wave signal adjusted so as to cause the phase of the input modulated wave signal to coincide with the phase of the delayed modulated wave signal.

Incidentally, the input modulated wave signal may be a modulated wave obtained by Minimum Shift Keying (hereinafter, referred to as "MSK"). Further, the demodulating section 10 comprises a multiplier 11 which performs a predetermined arithmetic operation of a delayed modulated wave signal and a phase-adjusted modulated wave signal, for example, by multiplication or the like to output a digital demodulating signal, and a low pass filter (hereinafter, referred to as LPF) 12 through which only a lower frequency component of an output from the multiplier 11 is allowed to pass.

The delay detection circuit 3 comprises a first frequency-dividing circuit 4 which produces a first frequency-divided clock having a frequency obtained by frequency-dividing a predetermined frequency S (Hz) of a sampling clock at a first frequency division ratio N1, and a first delaying circuit 5 which delays the input modulated wave signal by the first frequency-divided clock in a plural number X1 (a positive integer) of delay stages obtained by summing the stage number corresponding to the quotient of the clock number A of the sampling clock divided at the first frequency division ratio N1 with the remainder of the division as the final one stage to output the delayed modulated wave signal.

The phase-adjusting circuit 6 comprises a second frequency-dividing circuit 7 which outputs a second frequency-divided clock obtained by frequency-dividing the predetermined frequency of the sampling clock at a second frequency division ratio N2, which has a second frequency where a ratio coincident with the remainder of the final one stage in the first delaying circuit 5 is obtained between the first frequency-divided clock and the second frequency-divided clock, and a second delaying circuit 8 which is inputted with the input modulated wave signal and the second frequency-divided clock to delay the input modulated wave signal by the second frequency-divided clock and outputs a phase-adjusted modulated wave signal whose phase is coincident with the phase of the input modulated wave signal due to a delay corresponding to the stage number X2 (a positive integer) corresponding to the remainder in the final one stage of the first delaying circuit 5.

The remainder of the final one stage in the first delaying circuit 5 is the value obtained by dividing the remainder of the division A/N1 from 1.

A fundamental concept about parameters shown by marks attached to the above configuration will be explained. Assuming that the specification described below is required, a modulated wave which has been delayed by clock number (wave number) A with a sampling clock with S Hz and an original input modulated wave are calculated. Assuming that the first frequency division ratio of the first frequency-dividing circuit 4 is N1, the second frequency division ratio of the second frequency-dividing circuit 7 is N2, the stage number of delay stages of the first delaying circuit 5 is X1 (a positive integer), and the stage number of delay stages of the second delaying circuit 8 is X2 (a positive integer), with X1 being expressed with the following equation (1).

$$X1 = A/N1 \quad (1)$$

Here, when an integer portion of X1 is represented as Int(A/N1) and a fraction portion thereof is represented as Frc(A/N1), the equation (1) regarding X1 is expressed as the follow equation (2).

$$X1 = A/N1 = \text{Int}(A/N1) + \text{Frc}(A/N1) \quad (2)$$

Figure 2:
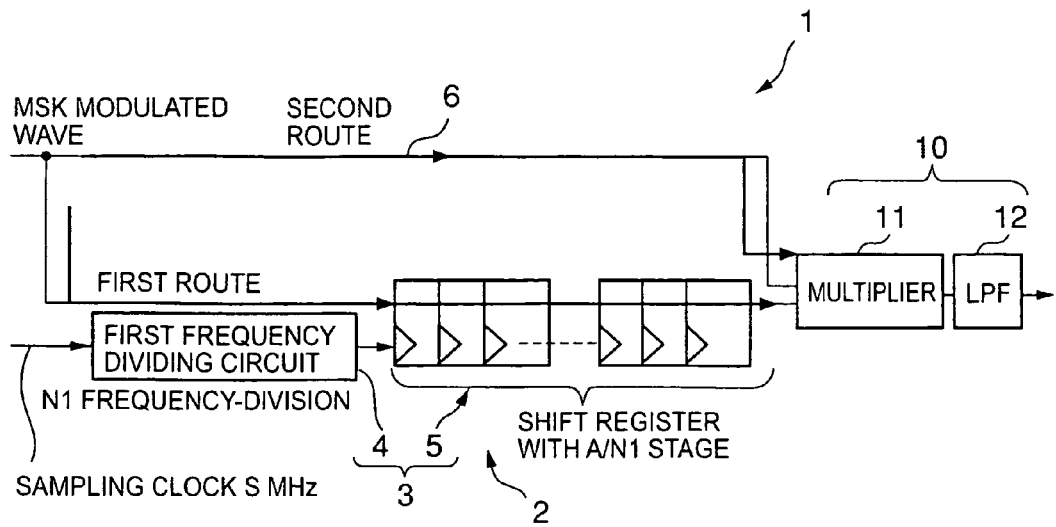
FIG. 2 is a block diagram for explaining an operation of a detecting section in case that the delay wave number of delay modulated waves of the first embodiment can be divided by a first frequency division ratio N1.

In the equation (2), the following two cases are examined.

i) A Case That Frc(A/N1)=0, Namely, X1 is an Integer:

As shown in FIG. 2, the delay detection section is formed with only a route 1, and it is unnecessary to delay the input modulated wave by a route 2 to adjust its phase.

ii) A Case That Frc(A/N1) is not 0:

It is necessary to input a delayed modulated wave obtained by delaying an input modulated wave by only [Int(A/N1)+1] stage and a delayed modulated wave obtained by delaying the input modulated wave by only (1-Frc(A/N1)) with a clock of the first frequency division ratio N1 into the multiplier 11. For this reason, the input modulated wave is delayed by the original input modulated wave which has been frequency-divided at the second frequency division ratio N2. In this case, the second frequency division ratio N2 can be represented by the first frequency division ratio N1 as the following equation (3).

$$N2 = \{N1 \ (1-\text{Frc}(A/N1))\}/X2 \quad (3)$$

By obtaining N2 so as to meet the equation (3), it is made possible to design a delay detection circuit with an optimal scale. More specific second and third embodiments where a specific numerical value is applied to the clock number or the frequency of a sampling clock will be explained below. In this connection, first, an upper conceptual constitution of the second and third embodiments will be explained as a specific constitution of the first embodiment using FIG. 3.

Figure 3:
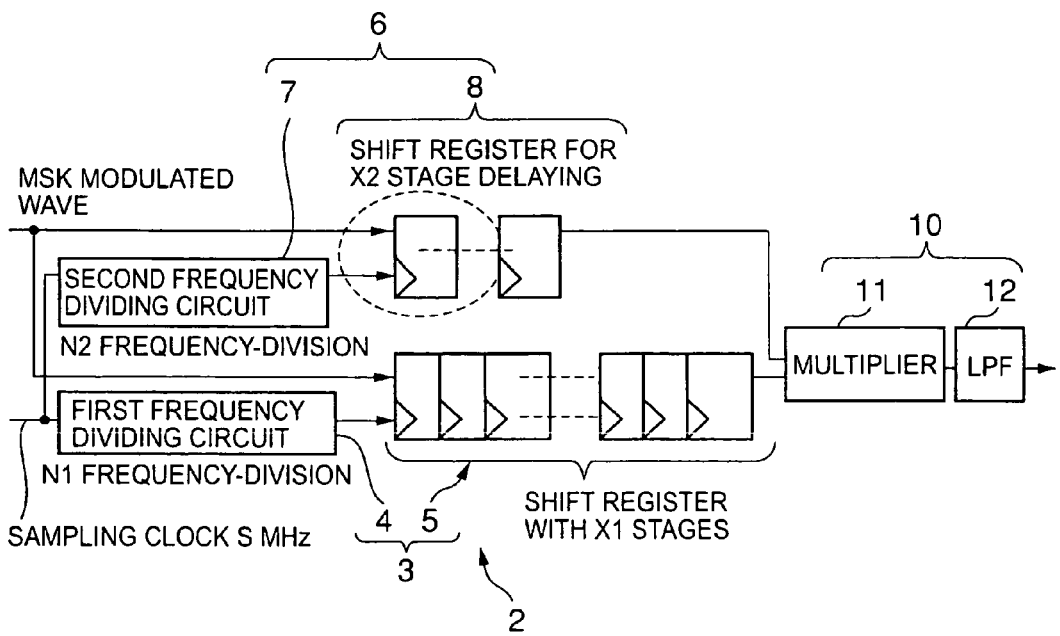
FIG. 3 is a block diagram for explaining an operation of a detecting section in case that the delay wave number of delay modulated waves in the first embodiment is not divided by a first frequency division ratio N1.

FIG. 3 is a block diagram showing a demodulator with a phase-adjusting mechanism or function according to a specific constitution of the first embodiment, where, as reference numerals used for denoting respective sections, reference numerals identical to or corresponding to ones used in FIG. 1 are used. In FIG. 3, a first delaying circuit 5 is constituted by a shift register comprising a flip-flop circuit having a stage number obtained by summing the quotient of the clock number of a sampling clock divided by the frequency division ratio of the first frequency dividing circuit 4 with the remainder as one stage, and a second frequency dividing circuit 7 has a second frequency division ratio having a ratio corresponding to a shortage in the final delay stage between the frequency division ratio of the first frequency dividing circuit 4 and the frequency division rate of the second frequency dividing circuit 7.

Figure 4:
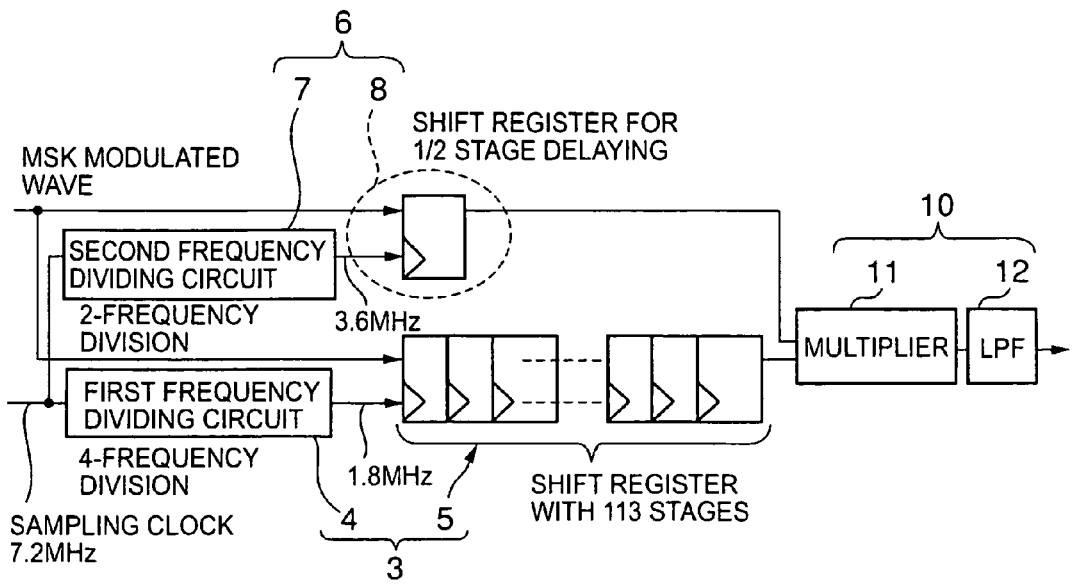
FIG. 4 is a block diagram showing a configuration of a demodulator having a phase-adjusting function according to a second embodiment of the present invention.

The demodulator with a phase-adjusting function according to the second embodiment will be explained on the basis of the above specific constitution example with reference to FIG. 4. In FIG. 4, in the case that a sampling clock is constituted with 450 clocks and has the predetermined frequency of 7.2 MHz, numerical values of individual circuits can be obtained by applying respective parameters into the above equations (1) to (3).

The first frequency dividing circuit 4 produces first frequency divided clocks with a clock frequency of 1.8 MHz at a first frequency division ratio of 4-frequency division to supply them to the first delaying circuit 5. The first delaying circuit 5 is constituted with the shift register comprising a flip-flop circuit having 113 stages obtained by summing 112 stages whose numerical value is the quotient of 450 clocks divided by 4 and ½ of the remainder as one stage. The frequency division ratio of the second frequency dividing circuit 7 is constituted so as to have the second frequency division ratio of 2-frequency division which becomes ½ (0.5) which is the shortage of one stage between the frequency division ratio of the first frequency dividing circuit 4 and that of the second frequency dividing circuit 7.

The second embodiment shows an example where a delay detection circuit of the second embodiment is applied to a digital demodulating circuit for FM multiplexed data. In the case of a modulated wave of the FM multiplexed data, the frequency of the sampling clock is 7.2 MHz, and the base band corresponds to 450 clocks of a carrier wave. In order to detect this input signal in the delay detection circuit, the input modulated wave must be delayed on the carrier wave of 7.2 MHz by 450 clocks, but such an FF circuit with 450 stages results in a considerably large circuit scale.

Therefore, for resource reduction, clocks with 1.8 MHz obtained by 4-frequency-dividing the sampling clock have been inputted into the delay shift register. In order to conduct delay corresponding to the base band by the clock frequency-divided in four, an FF circuit with 112.5 stages is required. However, since delay of 0.5 stages can not be conducted, as shown in FIG. 4, the delayed modulated wave is delayed by 113 stages with clocks of 1.8 MHz and the original modulated wave is delayed by one stage with the frequency of 3.6 MHz which is twice 1.8 MHz, so that two phases of these waves are prevented from being shifted.

Figure 5:
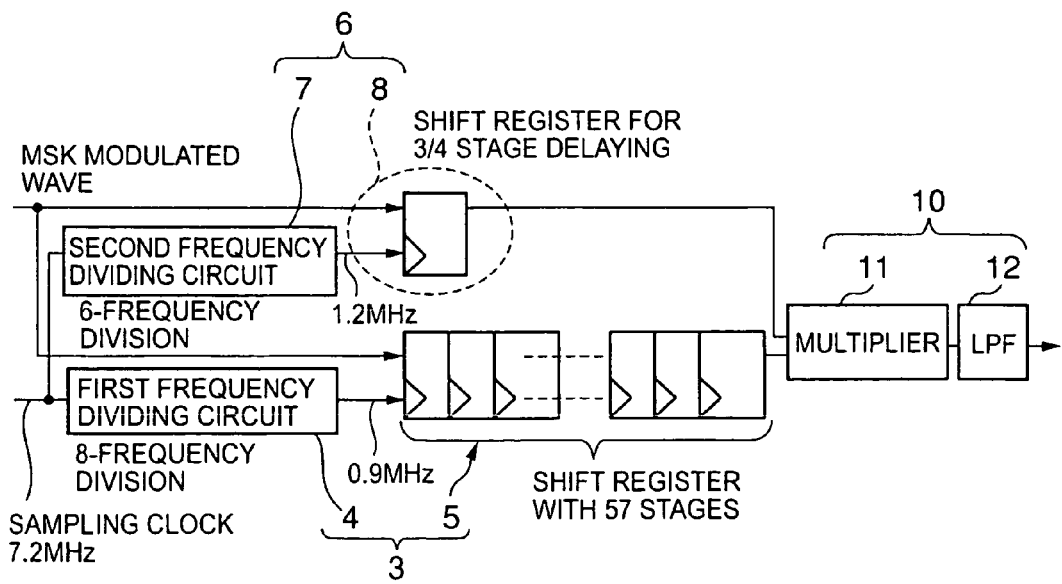
FIG. 5 is a block diagram showing a configuration of a demodulator having a phase-adjusting function according to a third embodiment of the present invention.

Next, a demodulator with a phase-adjusting function according to the third embodiment of the present invention will be explained with reference to FIG. 5. In the demodulator according to the third embodiment shown in FIG. 5, in order to delay an MSK modulated wave served as the input modulated wave by 450 clocks of a sampling clocks with a frequency of 7.2 MHz, a first frequency dividing circuit 4 produces a first frequency-divided clock obtained by frequency-dividing a clock frequency of 0.9 MHz at a first frequency division ratio of eight-divided frequencies to supply the same to the first delaying circuit 5, as illustrated.

Further, the first delaying circuit 5 is constituted with a shift register comprising a flip-flop circuit with 57 stages obtained by summing 56 stages whose numerical value is the quotient of 450 clocks divided by 8 with ¼ which is the remainder as one stage, and the frequency division ratio of the second frequency dividing circuit 7 is set to have a second frequency division ratio of 6-frequency division which becomes ¾ stages corresponding to a one stage shortage of a final stage between the frequency division ratio of 8-frequency division of the first frequency dividing circuit 4 and the 6-frequency division.

As explained in detail above, according to the phase-adjusting circuit in delay detection according to the above embodiments, by inserting an FF circuit for delaying an original modulated wave by a multiplied frequency of a shift register in a delay detection circuit, a circuit scale of the delay detection circuit can be reduced while maintaining a frequency detection precision.

What is claimed is:

1. A demodulator with a phase-adjusting function comprising:
   a detecting section including;
   a delay detection circuit which delays an input modulated signal in a plurality of delaying stages using a first frequency-divided clock obtained by frequency-dividing a sampling clock at a first frequency division ratio to output the delayed modulated wave signal, said sampling clock having a predetermined frequency and a predetermined clock number, and
   a phase-adjusting circuit which, when a quotient which is obtained by dividing the predetermined clock number at the first frequency division ratio does not become an integer, delays the input modulated wave signal using a second frequency-divided clock, said second frequency-divided clock being obtained by frequency-dividing the sampling clock at a second frequency division ratio, a ratio between said second frequency division ratio and said first frequency division ratio corresponding to the remainder of the quotient to produce a phase-adjusted modulated wave signal which has been adjusted to cause the phase of the input modulated wave signal to coincide with the phase of the delayed modulated wave signal; and
   a demodulating section which performs predetermined arithmetic operation of the delayed modulated wave signal and the phase-adjusted modulated wave signal to output a digital demodulated signal.

2. A demodulator with a phase-adjusting function according to claim 1, wherein the delay detection circuit comprises a first frequency dividing circuit which produces the first frequency-divided clock having a frequency obtained by frequency-dividing the predetermined frequency of the sampling clock at the first frequency division ratio, and a first delaying circuit which delays the input modulated wave signal by the first frequency-divided clock in a plurality of delaying stages, the stage number of which is obtained by summing a stage number corresponding to the quotient of the predetermined clock number of the sampling clock divided at the first frequency division ratio with the remainder of the division as a final one stage, said first delaying circuit outputting the delayed modulated wave signal; and the phase-adjusting circuit comprises a second frequency dividing circuit which outputs the second frequency-divided clock obtained by frequency-dividing the predetermined frequency of the sampling clock at the second frequency division ratio having a frequency where a ratio coincident with the shortage of the final one stage in the first delaying circuit is obtained between the second frequency-divided clock frequency and the first frequency-divided clock frequency, and a second delaying circuit which is inputted with the input modulated wave signal and the second frequency-divided clock to delay the input modulated wave signal by the second frequency-divided clock and outputs the phase-adjusted modulated wave signal whose phase is caused to coincide with the phase of the input modulated wave signal due to a delay corresponding to the remainder in the final one stage in the first delaying circuit.

3. A demodulator with a phase-adjusting function according to claim 2, wherein the first delaying circuit is constituted with a shift register comprising a flip-flop circuit having a stage number obtained by summing the quotient of the clock number of the sampling clock divided at a frequency division ratio of the first frequency dividing circuit with the remainder thereof as one stage, and the second frequency dividing circuit has a frequency division ratio based upon the remainder at the frequency division ratio of the first frequency dividing circuit.

4. A demodulator with a phase-adjusting function according to claim 1, wherein the delay detection circuit is included in a digital demodulating circuit for FM multiplexed data.

5. A demodulator with a phase-adjusting function comprising:
  a detecting section including;
    a delay detection circuit which delays an input modulated signal in delaying stages using a first frequency-divided clock obtained by frequency-dividing a sampling clock at a first frequency division ratio N1 to output the delayed modulated wave signal, said sampling clock having a predetermined frequency and a predetermined clock number A, said delaying stages having (Int(A/N1)+1) stages, and
    a phase-adjusting circuit which, when A/N1 is indivisible, delays the input modulated wave signal using a second frequency-divided clock, said second frequency-divided clock being obtained by frequency-dividing the sampling clock at a second frequency division ratio N2 to produce a phase-adjusted modulated wave signal which has been adjusted to cause the phase of the input modulated wave signal to coincide with the phase of the delayed modulated wave signal, said second frequency division ratio N2 implementing $N2=(N1*(1-Frc(A/N1)))/X2$; and
  a demodulating section which performs predetermined arithmetic operation of the delayed modulated wave signal and the phase-adjusted modulated wave signal to output a digital demodulated signal,
  wherein Int(A/N1) is an integer portion of A/N1, Frc(A/N1) is a fraction portion of A/N1 and X2 is a number of the delay stages in the phase-adjusting circuit.

6. A demodulator with a phase-adjusting function according to claim 5, wherein the delay detection circuit includes a shift register comprising flip-flop circuits having (Lnt(A/N1)+1)stages,
  the second frequency division ratio N2 is $(N1*(1-Frc(A/N1)))/X2$, and
  the phase-adjusting circuit includes a shift register comprising a flip-flop circuit having one stage.

7. A demodulator with a phase-adjusting function according to claim 5, wherein the delay detection circuit is included in a digital demodulating circuit for FM multiplexed data.

* * * * *